United States Patent

Lücke et al.

[11] Patent Number: 5,948,518
[45] Date of Patent: Sep. 7, 1999

[54] ELECTRICALLY CONDUCTIVE SHAPED ARTICLES

[75] Inventors: Andreas Lücke, Waldbrunn; Bernhard Pfeiffer, Kelkheim; Detlef Skaletz, Mainz, all of Germany

[73] Assignee: Hoechst Aktiengesellschaft, Frankfurt, Germany

[21] Appl. No.: 08/826,318

[22] Filed: Mar. 27, 1997

Related U.S. Application Data

[63] Continuation of application No. 08/291,622, Aug. 17, 1994, abandoned.

[30] Foreign Application Priority Data

Sep. 19, 1993 [DE] Germany .............................. 43 27 873

[51] Int. Cl.⁶ .................................. C08K 7/14; C08K 3/40
[52] U.S. Cl. ........................ 428/297.4; 428/327; 442/117; 442/180; 442/131; 442/341; 442/377
[58] Field of Search .................................. 428/297.4, 327; 442/117, 180, 131, 341, 377

[56] References Cited

U.S. PATENT DOCUMENTS

| | | | |
|---|---|---|---|
| 4,973,514 | 11/1990 | Gamble et al. | 428/297 |
| 5,034,157 | 7/1991 | Merrell et al. | 252/512 |
| 5,093,037 | 3/1992 | Ohi et al. | 252/512 |

FOREIGN PATENT DOCUMENTS

| | | |
|---|---|---|
| 0176866 | 4/1986 | European Pat. Off. . |
| 3923917 | 1/1990 | Germany . |

OTHER PUBLICATIONS

J.M. Crosby in "Thermoplastic Composite Material," L.A. Carlsson, ed., pp. 139–143, Elsevier, New York (1991).
"Concise Encyclopedia of Composite Materials," A. Kelly, ed., pp. 113–116, Pergamon Press, New York (1989).
Derwent Publications Ltd., London, GB, Abstract No. J63090564 published Apr. 21, 1988.
Derwent Publications Ltd., London, GB, Abstract No. J60189105 published Sep. 26, 1985.
Derwent Publications Ltd., London, GB, Abstract No. J04232028 published Aug. 20, 1992.
Derwent Publications Ltd., London, GB, Abstract No. J06073248 published Mar. 15, 1994.
"Property Data Sheet" for Celstran S by Polymer Composites Incorporated.

*Primary Examiner*—Deborah Jones
*Assistant Examiner*—Cathy F. Lam
*Attorney, Agent, or Firm*—Frommer Lawrence & Haug LLP

[57] ABSTRACT

This invention relates to an electrically conductive shaped article made from thermoplastic materials which are reinforced with glass and steel fibers wherein said fibers are incorporated into the thermoplastic material by pultrusion. The amount of glass fibers incorporated into the thermoplastic material is such that the specific conductivity is at least 10% greater than in a shaped article in which the glass fibers are replaced by thermoplastic material. The shaped article can be used for shielding an article from electromagnetic radiation.

9 Claims, No Drawings

ELECTRICALLY CONDUCTIVE SHAPED ARTICLES

This application is a continuation of application Ser. No. 08/291,622, filed Aug. 17, 1994, abandoned.

BACKGROUND OF THE INVENTION

FIELD OF THE INVENTION

The present invention relates to electrically conductive shaped articles of thermoplastic material and to their use.

Plastics which comprise conductive fillers, in particular steel fibers, are used for the production of components of high electrical conductivity and, if appropriate, additionally good mechanical properties.

The wide use of theme conductive plastics for the production of shaped articles is counteracted by the high material costs of the stainless steel filaments, which are about 20 to 30 times those of glass fibers.

Cheaper carbon black fillings are not capable of achieving conductivities which are required for significant electromagnetic shielding. In addition, the mechanical properties deteriorate because of the carbon black filling. Thus, test articles of various polyamides having a content of 30% by weight of carbon black show only half the tensile strength of the non-filled starting material.

The content of stainless steel filaments/steel filaments necessary to render a plastic electrically conductive can be modified only within certain limits. If the amount is no longer adequate to develop a conductivity network, the conductivity drops sharply.

In order to increase the conductivity, according to U.S. Pat. No. 4 973 514, metal fibers or metalized glass fibers can be incorporated into the plastic, advantageously with the addition of finely divided conductive fillers, such as carbon black, for the production of shaped articles. If non-conductive fibers furthermore are added, the electromagnetic shielding effect in intensified. The process mentioned is similar to the production of paper. To produce massive shaped articles, it is necessary for the conductive film initially obtained to be cut into chips and for the chips to be processed by injection molding. The process described requires effort and is expensive. The short length and poor distribution of the fibers in the shaped article leads to only weak shielding efficiencies.

In the period from 1989 to 1993, mixtures of fiber-reinforced pellets (length 1 to 2 cm) of thermoplastic material which were reinforced on the one hand by steel fibers (about 4 to 10% by weight) and on the other hand by glass fibers (20 to 60% by weight) were sold (polymer composites, Inc., USA) under the name ®CELSTRAN S. However, no pellets which were reinforced simultaneously by steel fibers and glass fibers were sold.

There was therefore the object of producing shaped articles which comprise steel fibers, can easily be produced, and in particular have a high conductivity and therefore good shielding from electromagnetic waves.

The present invention achieves this object.

SUMMARY OF THE INVENTION

An electrically conductive shaped article which comprises a reinforced thermoplastic material has now been found. The shaped article has the feature that glass fibers and steel fibers are used side by side* for the reinforcement. The amount of glass fibers is preferably such that the specific conductivity of the material of the shaped article is at least 10% higher than in a shaped article in which the glass fibers are replaced by the thermoplastic material. Specific conductivity here means the surface and/or volume conductivity.

The material of the shaped article comprises less than 20% by weight of steel fibers, preferably 5 to 10% by weight of steel fibers. The content of glass fibers in the material is less than 60% by weight. The weight ratio of steel fibers/glass fibers is preferably in the range from 2:1 to 1:2. The length of the glass fibers is in general below 20 mm (preferably below 15 mm). The diameter of the glass fibers in preferably 10 to 20 $\mu$m.

The steel fibers used preferably have a length of 1 to 20 mm. The thickness of the steel fibers is preferably 5 to 15 $\mu$m.

The shaped articles according to the invention can be produced by several processes, for example by extrusion, by a plasticizing/stretching/pressing process or by similar processes, but preferably by injection molding. In all these processes, a mixture of glass fiber/steel fiber and thermoplastic material in melted and the melt is shaped and then cooled.

To prepare the injection molding composition used, thermoplastic granules which already comprise steel fibers can be mixed with thermoplastic granules which comprise glass fibers. Preferably, the same bass polymers, but in particular miscible base polymers, are used in the two granules. The melt viscosities are preferably at a comparable level. Granules which comprise 30 to 70% by weight of steel fibers can be prepared from steel fiber roving by known pultrusion processes, for example in accordance with U.S. Pat. No. 4 312 917 or U.S. Pat. No. 4 439 387. The length of the steel fibers corresponds here to the granule length. The granules of plastic reinforced with glass fibers can be long glass fiber granules or short glass fiber granules. Long glass fiber granules can be prepared by pultrusion of a continuous glass fiber strand. The glass fiber length corresponds to the length of the granules. In the case of short glass fiber granules, cut glass is compounded into the thermoplastic material. In this case, the glass fiber length is typically below 0.5 mm; i.e. it is lower than the granule length.

It is also possible to process thermoplastic material and steel fibers simultaneously to fiber-reinforced chips by pultrusion.

The thermoplastic material is preferably chosen from the group consisting of amorphous thermoplastics, such as polycarbonate, and acrylonitrile/butadiene/styrene copolymers, or PC/ABS blends, or partly crystalline thermoplastics, such as polypropylene, polyamide 66, polybutylene terephthalate or polyphenylene sulfide.

It is surprising that on addition of non-conductive glass fibers to granules of plastic filled with steel fibers, the volume resistivity of the shaped articles produced therefrom decreases.

The fiber-reinforced shaped articles according to the invention have a high electrical conductivity and good shielding against electromagnetic radiation. Furthermore, the addition of glass fibers leads to a mechanical reinforcement of the component. The tensile and flexural strength can be, for example, at least 10% greater than in a shaped article in which the glass fiber content is replaced by thermoplastic material.

The shaped articles according to the invention can be, for example, housings for electrical control systems and regulation systems in the field of microelectronics, telecommunications and the automobile industry, or other applications which specify a conductive material or protection from electrical and magnetic fields or electromagnetic waves. They can replace metals here. Shaped articles having a content of at least 1% of steel fibers show antistatic properties. They can be employed in particular where removal of electrical surface charges is important.

The invention is illustrated in more detail by the examples.

COMPARISON EXAMPLE 1

To prepare the injection molding composition, two different types of granules of plastic were blended. A polycarbonate filled with steel fibers and having a content of stainless steel filaments of 60% by weight was adjusted to a steel fiber content of 10% by weight with commercially available granules of non-reinforced polycarbonate.

The pultrusion process according to U.S. Pat. No. 4 439 387 was used to prepare the polycarbonate filled with steel fibers. Fiber rovings of 9200 tex, 12,000 individual filaments and a fiber diameter of about 10 $\mu$m were employed. The fiber length in the granules was 12.7 mm.

The mixture of granules was processed to housing components by injection molding. The volume resistivity was determined in accordance with DIN VDE 0303 (Table 1, line 1). It was 60 ohm cm.

EXAMPLE 2

The specimens were prepared as in Example 1. Instead of the commercially available polycarbonate granules, commercially available polycarbonate granules reinforced with short glass fibers were used for blending. The mixture was processed to housing components and the volume resistivity was determined as in Example 1.

TABLE 1

Measurement of the volume resistivity in accordance with DIN VDE 0303

| Thermoplastic | Steel fiber | Glass fiber | Volume resistivity ohm cm |
|---|---|---|---|
| Polycarbonate | 10% by weight | 0% by weight | 60 |
| Polycarbonate | 10% by weight | 9% by weight | 10 |

EXAMPLE 3

A polyearbonate concentrate filled with steel fibers and having a steel fiber content of 60% by weight was adjusted to a steel fiber content of 10% by weight by blending with
a) granules of a non-reinforced commercially available polycarbonate
b) commercially available polycarbonato granules reinforced with short glass fibers.

Housing components were obtained by injection molding and these were measured with the Faradex motor from DSM, The Netherlands.

TABLE 2

Measurement with the Faradex meter

| Thermoplastic | Steel fiber | Glass fiber | Faradex meter resistance |
|---|---|---|---|
| Polycarbonate | 10% by weight | 0% by weight | 0.8 ohm |
| Polycarbonate | 10% by weight | 8% by weight | 0.2 ohm |

We claim:

1. An electronically conductive shaped article consisting essentially of reinforced thermoplastic material, wherein the material is reinforced by strands of continuous glass and steel fibers, which fibers are incorporated into the thermoplastic material by pultrusion, wherein said glass fibers are about 2 to 60 percent by weight and said steel fibers are about 5 to 19.5 percent by weight, and wherein the amount of glass fibers is such that the specific conductivity is at least 10 percent greater than any shaped article wherein the thermoplastic material is present rather than glass fibers.

2. A shaped article as claimed in claim 1, which is reinforced by short glass fibers.

3. A shaped article as claimed in claim 1, which is free from long glass fibers.

4. In a method of shielding an article from electromagnetic fields wherein the improvement comprises using an electrically shaped article according to claim 1.

5. An electrically conductive shaped article consisting essentially of reinforced thermoplastic material, wherein the material is reinforced by strands of steel fibers which are incorporated into the thermoplastic material by pultrusion, and wherein the thermoplastic material is cut to chips, which are admixed with chips which comprise glass fibers in a thermoplastic material, and wherein the chip mixture is shaped thermally under the action of pressure to produce the electrically conductive shaped article.

6. A shaped article according to claim 5, which is reinforced by 5 to 19.5% by weight of steel fibers and 2 to 60% by weight of glass fibers.

7. A shaped article according to claim 5 which is reinforced by short glass fibers.

8. A shaped article according to claim 5, which is free from long glass fibers.

9. In a method of shielding an article from electromagnetic fields, wherein the improvement comprises using the electrically shaped article according to claim 5.

* * * * *